(12) United States Patent
Benner

(10) Patent No.: US 7,040,967 B2
(45) Date of Patent: May 9, 2006

(54) MULTI-STEP, IN-SITU PAD CONDITIONING SYSTEM AND METHOD FOR CHEMICAL MECHANICAL PLANARIZATION

(75) Inventor: Stephen J. Benner, Lansdale, PA (US)

(73) Assignee: TBW Industries Inc., Furlong, PA (US)

( * ) Notice: Subject to any disclaimer, the term of this patent is extended or adjusted under 35 U.S.C. 154(b) by 0 days.

(21) Appl. No.: 11/042,998

(22) Filed: Jan. 25, 2005

(65) Prior Publication Data

US 2005/0186891 A1  Aug. 25, 2005

Related U.S. Application Data

(60) Provisional application No. 60/539,162, filed on Jan. 26, 2004.

(51) Int. Cl.
*B24B 1/00* (2006.01)
(52) U.S. Cl. .................. 451/56; 451/41; 451/285; 451/443; 438/692; 134/2
(58) Field of Classification Search .............. 451/41, 451/56, 60, 63, 72, 91, 285–290, 443, 444, 451/910, 921; 438/691, 692, 959; 134/2, 134/3, 42
See application file for complete search history.

(56) References Cited

U.S. PATENT DOCUMENTS

| | | | |
|---|---|---|---|
| 5,725,417 A * | 3/1998 | Robinson | 451/56 |
| 5,779,521 A * | 7/1998 | Muroyama et al. | 451/56 |
| 5,782,675 A * | 7/1998 | Southwick | 451/56 |
| 5,876,508 A * | 3/1999 | Wu et al. | 134/2 |
| 5,961,373 A | 10/1999 | Lai et al. | |
| 6,022,266 A | 2/2000 | Bullard et al. | |
| 6,030,487 A | 2/2000 | Fisher et al. | |
| 6,179,693 B1 | 1/2001 | Beardsley et al. | |
| 6,193,587 B1 | 2/2001 | Lin et al. | |
| 6,217,422 B1 * | 4/2001 | Franca et al. | 451/56 |
| 6,227,947 B1 * | 5/2001 | Hu et al. | 451/56 |
| 6,241,587 B1 * | 6/2001 | Drill et al. | 451/56 |
| 6,263,605 B1 | 7/2001 | Vanell | |
| 6,302,771 B1 | 10/2001 | Liu et al. | |
| 6,340,326 B1 | 1/2002 | Kistler et al. | |
| 6,409,579 B1 | 6/2002 | White, II et al. | |
| 6,508,697 B1 | 1/2003 | Benner et al. | |
| 6,547,652 B1 | 4/2003 | Roy | |
| 6,554,688 B1 | 4/2003 | Lacy | |
| 6,554,951 B1 | 4/2003 | Page et al. | |
| 6,572,453 B1 | 6/2003 | Wijekoon et al. | |

(Continued)

*Primary Examiner*—Lee D. Wilson
*Assistant Examiner*—Anthony Ojini

(57) ABSTRACT

An arrangement for performing a multi-step polishing process on a single stage chemical mechanical planarization (CMP) apparatus utilizes an in-situ conditioning operation to continuously clean and evacuate debris and spent polishing slurry from the surface of the polishing pad. By presenting a clean, virtually "new" polishing pad surface at the beginning of each planarization cycle, polishing agents of different chemistries, morphologies, temperatures, etc. may be used without the need to remove the wafer to change the polishing source or transfer the wafer to another CMP polishing station. A multi-positional valve may be used to control the introduction of various process fluids, including a variety of different polishing slurries and conditioning/flushing agents. The use of different conditioning materials allows for the surface of the polishing pad to be altered for different process conditions (e.g., neutralizing prior polishing chemicals, modifying the surface temperature of the pad to control polishing rate, use of surfactants to dislodge particles that become attracted to the pad surface, etc.).

24 Claims, 3 Drawing Sheets

U.S. PATENT DOCUMENTS

| | | |
|---|---|---|
| 6,626,743 B1 | 9/2003 | Boyd |
| 6,645,046 B1 | 11/2003 | Vogtmann et al. |
| 6,672,949 B1 | 1/2004 | Chopra |
| 2001/0039171 A1 | 11/2001 | Aiyer |
| 2002/0137436 A1 | 9/2002 | Kistler et al. |
| 2004/0192168 A1 | 9/2004 | Faustmann et al. |

* cited by examiner

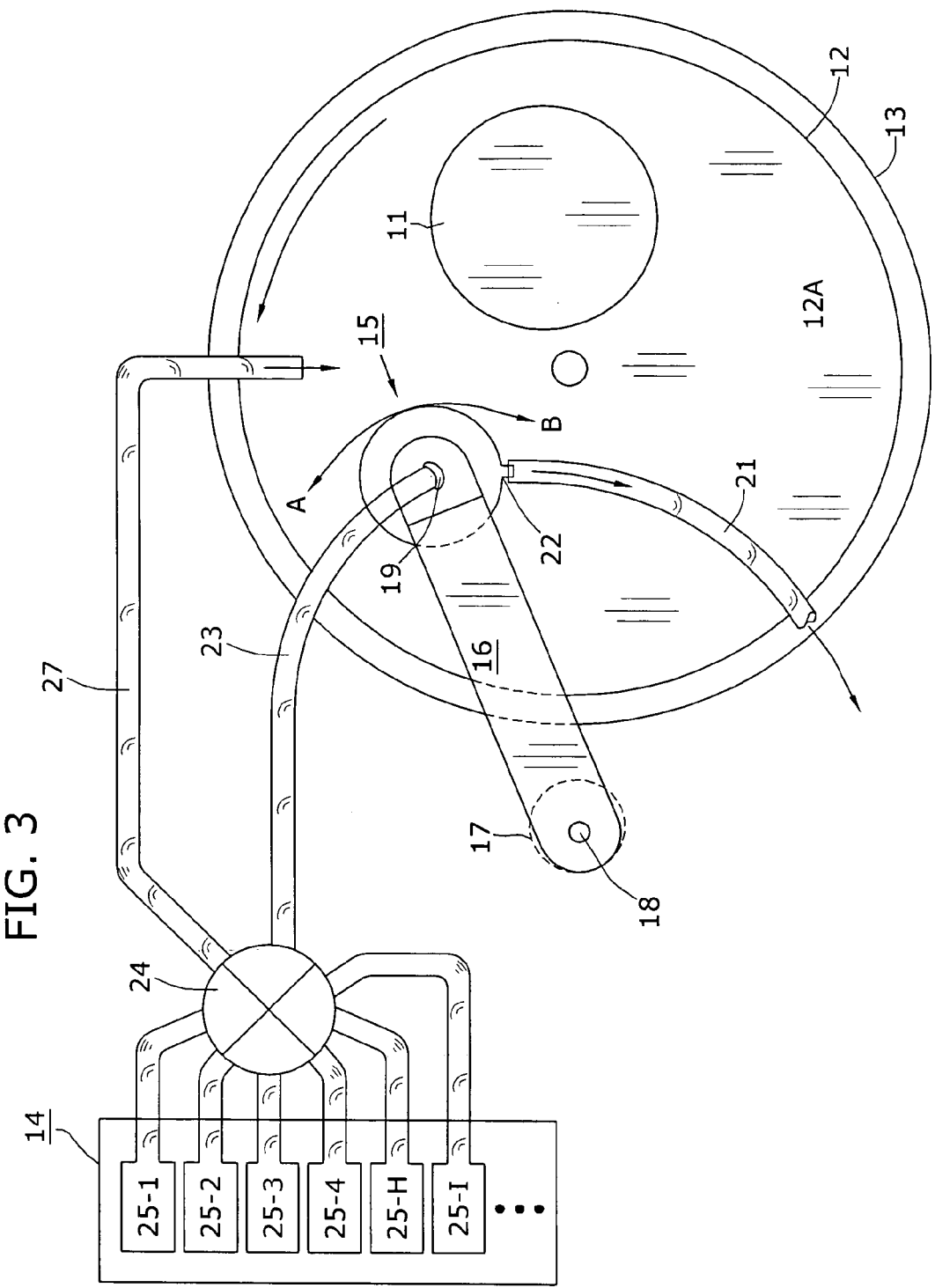

MULTI-STEP, IN-SITU PAD CONDITIONING SYSTEM AND METHOD FOR CHEMICAL MECHANICAL PLANARIZATION

CROSS-REFERENCE TO RELATED APPLICATION

The application claims the benefit of Provisional Application No. 60/539,162, filed Jan. 26, 2004.

TECHNICAL FIELD

The present invention relates to a system for conditioning a polishing pad used in a chemical mechanical planarization (CMP) system and, more particularly, to an in-situ conditioning technique that allows for multiple polishing operations (using different chemistries and/or electrolytes), in sequence, at a single station.

BACKGROUND OF THE INVENTION

The electronics industry continues to rely upon advances in semiconductor manufacturing technology to realize higher-functioning devices while improving reliability and cost. For many applications, the manufacture of such devices is complex, and maintaining cost-effective manufacturing processes while concurrently maintaining or improving product quality is difficult to accomplish. As the requirements for device performance and cost become more demanding, realizing a successful manufacturing process becomes more difficult.

Indeed, as the level of integration of the circuits increases, the devices become smaller and more densely packed, requiring more levels of photolithography and more processing steps. As more layers are built upon the silicon starting wafer, problems caused by surface non-planarity become increasingly severe and can impact yield and chip performance. In fact, it becomes more and more necessary to remove excess material from the wafer in a process commonly referred to as planarization (or, at times, "polishing").

A common technique used to planarize the surface of a silicon wafer is chemical mechanical planarization (CMP). CMP involves the use of a polishing pad affixed to a polishing table and a separate holder to present the silicon wafer face-down against the pad surface. A slurry containing abrasive and chemical additives is dispensed onto the surface of the polishing pad and used to remove irregularities from the surface of the wafer through both mechanical and chemical means. An extension of this CMP process, referred to as ECMP, involves the use of electrical energy so as to remove unwanted material cathodically via an electrolyte. The polishing pad itself is typically chosen for its ability to act as a carrier of the slurry (or electrolyte) as well as its ability to provide the desired mechanical force against the wafer surface being polished.

The wafer and polishing pad commonly rotate relative to each other. The rotation action, along with the abrasive and chemical additives of the slurry, results in a polishing action that removes material from the surface of the wafer. Protrusions on the surface erode more efficiently than recessed areas, leading to a flattening—or planarization—of the wafer surface.

As the length of time a wafer is polished increases, and/or the number of wafers that have been polished increases, the polishing pad will become filled with debris as a result of the accumulation of removed wafer material, chemical reaction by-products and abrasives from the slurry. This deposited debris causes the polishing pad to become matted down and/or wear unevenly, also known as the "glazing effect". Thus, it becomes necessary to restore the polishing pad to a state suitable for continued wafer polishing.

"Pad conditioning" or "pad dressing" is a process known in the art that is used to restore the surface of the polishing pad and remove the glazing by dislodging particulates and spent polishing slurry from the pad. Pad conditioning also planarizes the pad by selectively removing pad material, and roughens the surface of the polishing pad. Pad conditioning may be performed "ex-situ" (i.e., conditioning the polishing pad between wafer polishing cycles), or "in-situ" (i.e., concurrent with, or during, the wafer polishing cycle). In a typical prior art "in-situ" pad conditioning process, a fixed abrasive disk is brushed along the pad surface to remove a small amount of pad material and debris, thus creating new asperities for allowing the polishing slurry to flow freely. The removed pad material and debris then combine with the slurry flow stream of the polishing process, and are passively carried away from the pad and the wafer being polished by normal slurry transport mechanics. Ultimately, these materials are flushed at the end of the polishing cycle with rinse water, and collected in the central drain of the polisher.

As different materials come into use for integrated circuit fabrication, the CMP process must keep pace in its ability to react with and planarize these different materials. For example, copper has become an increasingly popular choice for interconnect metal and has begun replacing aluminum and/or tungsten in certain applications. Copper is much more conductive than these other metals, allowing the formation of finer wires having lower resistive losses. Although copper provides advantages over aluminum, it has at least one major disadvantage: copper is specifically adverse to silicon, since it readily diffuses into silicon and results in deep-level defects. Therefore, copper must be isolated from silicon during the formation of integrated circuit devices, usually through the use of a suitable "barrier" layer metal. A metal CMP process thus requires the implementation of a multi-step planarization process, using different polishing slurries and/or parameters to remove different surface materials. For example, in copper CMP, one chemistry is required to remove the non-planar copper and another chemistry to remove the barrier material. In the past, a first polishing station may have been set up to remove the bulk copper, a second polishing station to remove the barrier material, and a third station to perform a final buffing operation, since cross-contamination from the different polishing agents would invariably occur if only a single station were to be used.

With respect to conventional, dielectric CMP, some manufactures suggest the use of multiple polishing stations, with "partial polishing" processes being performed at each station. For example, a first station would be used to perform an initial planarization (perhaps time dependent) to remove bulk unwanted material, a second station to finish the planarization and a third station to perform a buffing operation. Each of these stations may utilize the same polishing chemistry, but would employ different techniques for process control (downforce, speed, endpoint detection, etc.). The use of multiple stations in this case improves the throughput for the CMP system, since each polishing step is shorter, but the improvement in throughput is achieved at the risk of three separate wafers/polishing supplies/stations needing to simultaneously be involved in the fabrication process.

Thus, even though the use of multiple polishing stations may provide process improvement for CMP systems, such an arrangement becomes extremely time-consuming, capital intensive and expensive. A need remains in the art, therefore, for an arrangement for performing a multi-step polishing process in a CMP system that requires the use of only a single polishing station.

SUMMARY OF THE INVENTION

A need remaining in the prior art is addressed by the present invention, which relates to a system for conditioning a polishing pad used in a chemical mechanical planarization (CMP) system and, more particularly, to an in-situ conditioning technique that allows for multiple polishing slurries to be used, in sequence, at a single polishing station.

In accordance with the present invention, a CMP system utilizes an abrasive conditioning disk with an open structure to dislodge the debris, in real time, as it is being ground off of the wafer surface and deposited within the top surface of the polishing pad. A vacuum source is coupled to the conditioning disk and used to pull the debris dislodged from conditioning (or, if the abrasive is not engaged, the liquid resident in the pores at the pad surface) away from the polishing pad. A fresh, uniform pad surface is therefore created at the end of the conditioning process, where additional flushing capabilities may be added to assist the conditioning process. The inventive conditioning process has been found to thoroughly clean the pad surface of all materials (i.e., the polishing slurry and debris), allowing for alternative polishing materials to be introduced on a single polishing station without causing cross-contamination. Moreover, the immediate removal of all waste materials from the pad surface minimizes the amount of excess water that is generated as a by-product of the polishing process, where the excess water otherwise causes an undesirable dilution of the polishing slurry if allowed to remain on the pad surface.

It is an advantage of the arrangement of the present invention that the use of a real-time, in-situ pad conditioning process allows for various changes to be made in the chemistry of the planarization process "on the fly", without requiring any re-tooling of the polishing station or moving of the wafer being polished to another polishing station. For example, different polishing chemicals may be applied in sequence (e.g., to remove different materials in sequence), different particulate sizes or concentrations may be used in the polishing slurry (e.g., decreasing in percent solids concentration as the polishing process continues), or the conditioning process may utilize different conditioning fluid temperatures (e.g., to modify the removal rate), different complexing agents (e.g., to keep copper in solution), or chemical neutralizers, surfactants and/or cleaning agents to manage the chemical regime. All of these variations, and others, are possible as a result of using the in-situ conditioning arrangement.

Other and further advantages and aspects of the present invention will become apparent during the course of the following discussion and by reference to the accompanying drawings.

BRIEF DESCRIPTION OF THE DRAWINGS

Referring now to the drawings,

FIG. 3 is a top view of a portion of the arrangement of FIG. 2; and

DETAILED DESCRIPTION

As mentioned above, the conditioning process of the present invention is designed to create a fresh, uniform polishing pad surface in-situ by removing unwanted residue from the polishing pad as soon as it is dislodged, the vacuum-assisted removal perhaps using additional flushing capabilities, as will be discussed in detail hereinbelow. In addition to its conventional cleaning/conditioning function, the inventive arrangement has been found to decrease the presence of surface defects on the polished wafer surface, reduce "heavy" waste stream volume (by collecting the polishing and conditioning process residue stream separate from other process waters) and simplify the copper and barrier metal planarization processes.

While the system of the present invention is applicable to any CMP process, it is particularly well-suited to a metal CMP process where extraneous metal (for example, copper) and other barrier metal materials need to be cleared from the wafer surface. Thus, while the following discussion will focus on metal CMP, the broader applicability of the present invention to all CMP processes needs to be kept in mind. Indeed, it is presumed that the conditioning process is equally applicable to an electrochemical CMP (ECMP) system, where the electrolytes utilized to remove surface material may also be evacuated from the polishing pad surface as soon as the conditioning process is completed, thereby allowing for improved electro-chemical control through improved management of the electrolyte's in-situ chemistry.

Figure 1:
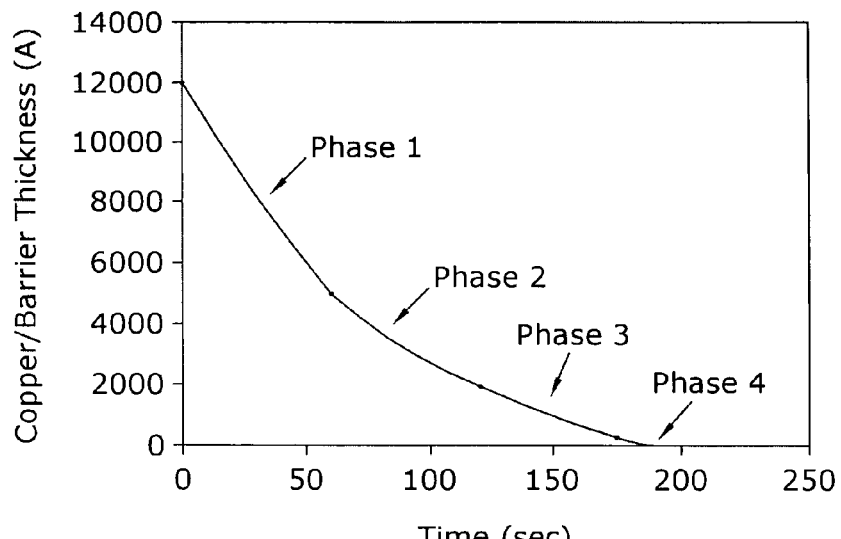
FIG. 1 contains a plot of removal rates of over-burden copper and barrier metal as required for a multi-step polishing process, this particular process including four separate steps (phases)

Regarding metal CMP, there are numerous planarization schemes known in the art for the removal of over-burden copper and barrier metals from processed silicon wafers. One of these schemes calls for the use of an initial polishing slurry with a high removal rate for copper, a transient polishing slurry with a moderate copper removal rate for chemical soft landing, and then a barrier polishing slurry (of a different chemical composition) to remove the barrier metal. These various rates are illustrated in the graph of FIG. 1. Indeed, FIG. 1 is associated with one possible planarization scheme, involving chemical soft landing, that can be divided into several phases. For example, phases 1 and 2 are associated with bulk copper removal (removal rates of 7000 A/min and 3000 A/min, respectively). Phase 3 is associated with copper clearing (a removal rate of no more than 2000 A/min), and phase 4 is associated with barrier removal (copper removal rate of approximately 200–500 A/min, and barrier removal at approximately 500 A/min).

A practical difficulty with the implementation of this multi-step planarization scheme, as mentioned above, is that the most straightforward approach requires the use of multiple polishing stations, with a different polishing slurry used at each station. In addition, the barrier removal and/or buffing processes often requires the use of a softer polishing pad, as a result of the possibility for creating defects in the softer copper regions on the wafer surface. Otherwise, if only a single polishing station is used, the possibility of cross-contamination (and less controllable removal rates, selectivity and defectivity) between different polishing schemes remains a great concern.

In accordance with the present invention, multiple polishing steps are integrated into as few as one operation and are performed at as few as a single polishing station, thus eliminating the need to lift the carrier and move to another station to change the polishing slurry. Moreover, only one pad needs to be used for all of the polishing steps, since the immediate debris removal reduces the chance of the pad surface causing wafer defects during polishing. The ability to control the introduction of different polishing slurry materials, by virtue of the inventive use of a multi-position valve and an in-situ, vacuum-assisted conditioning system, is seen to provide a significant advance of the state of the art.

Figure 2:
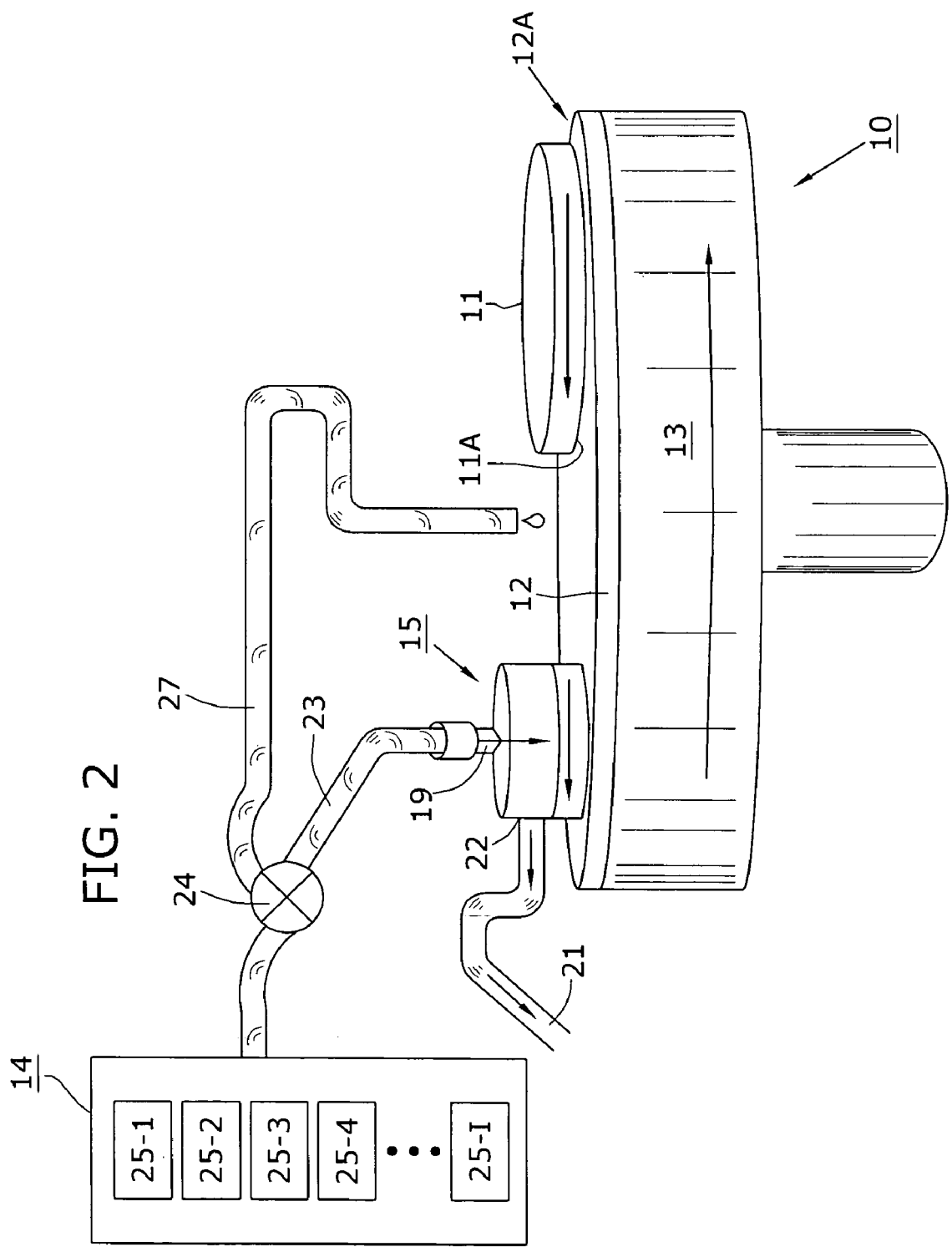
FIG. 2 illustrates an exemplary arrangement for accomplishing multi-source CMP polishing in accordance with the present invention.

FIG. 2 contains a side view, and FIG. 3 a top view, of an exemplary CMP system 10 that may be used to perform a multi-step planarization process, with in-situ vacuum-assisted conditioning, in accordance with the present invention. Referring to FIG. 2, CMP system 10 is illustrated generally as comprising a polishing pad 12 that is secured to a platen 13. While platen 13 is illustrated as being circular, it is to be understood that other systems may use a linear platen, an orbital platen, or any other geometry appropriate for performing the polishing process on a semiconductor wafer surface. A wafer carrier (not shown) is used to secure a wafer-to-be-polished 11 "face down" onto system 10, with a polishing head (also not shown) used to apply a controlled, downward pressure onto surface 11A of wafer 11 as it contacts top surface 12A of polishing pad 12. A stream of polishing slurry is introduced onto polishing pad surface 12A through a dispensing arrangement 14, where the dispensed slurry generally contains an oxidizer, abrasive and/or ultra-pure water (UPW). In an alternative arrangement, a stream of electrolyte is used in the first polishing step, where electrochemical-assisted CMP (ECMP) is used for the bulk copper removal, followed by conventional CMP for barrier and subsequent steps. Dispensing arrangement 14, in one embodiment, may be incorporated as part of the conditioning apparatus. Alternatively, dispensing arrangement 14 may be a separate, stand-alone module or incorporated as part of the mechanical polishing unit. Any arrangement is equally suitable for use in performing the tasks of the present invention.

Referring back to FIG. 2, the conditioning process of the present invention is performed by a conditioning apparatus 15, which is also positioned against surface 12A of polishing pad 12. In general, conditioning apparatus 15 functions to remove the various types of debris, such as polishing slurry, wafer debris, abraded material, chemical by-products of the polishing operation, etc., that accumulate during the wafer polishing process. As described in a co-pending application assigned to the current assignee, a conditioning disk within conditioning apparatus 15 is formed of an abrasive material and contains a number of apertures/openings formed therethrough. The abrasive material serves to dislodge the debris as it collects on polishing pad surface 12A. Conditioning "fluids", such as water or other flushing agents (as well as specifically-chosen chemicals), may be dispensed from dispensing arrangement 14 and then through conditioning apparatus 15 onto polishing pad surface 12A to assist in the debris removal and pad surface management and/or neutralization processes.

As best illustrated in FIG. 3, conditioning apparatus 15 may be mounted on a motorized effector arm 16 to allow conditioning apparatus 15 to sweep back and forth across the surface of polishing pad 12 (illustrated by arc AB in FIG. 3) so as to dislodge the collected debris, while also imparting a predetermined downward force and rotational movement to the conditioning disk. A motor 17 is used in this particular embodiment to both pivot end effector arm 16 in arc AB (or through any other appropriate translational movement) about a fixed shaft 18, while simultaneously providing rotational motion and applying a downward force to the conditioning disk. Alternatively, a pad conditioner within apparatus 15 may be formed to cover the entire pad radius and not require the use of a motor or the pivoting of an end effector arm to provide across-pad conditioning.

In accordance with the present invention, a first hose 21 is illustrated as attached to a vacuum outlet port 22 on conditioning apparatus 15, where an applied vacuum force may be used to pull debris, spent polishing fluid and any conditioning agents (generally referred to as "effluent") off of polishing pad 12 and into a vacuum facility (not shown) as soon as it is created (or, alternatively, at some other predetermined, controlled point in the conditioning process). There may be occasions where the combination of the flushing agent and vacuum removal will be sufficient to clean a polishing pad, without the need to apply an abrasive to the pad surface to dislodge debris. In this case, the abrasive conditioning disk will remain in a raised position (or maintained at a "zero" downforce) with respect to surface 12A of polishing pad 12.

Referring to FIG. 3, a second hose 23 is attached to an inlet port 19 of conditioning apparatus 15, where second hose 23 passes through the top of conditioning apparatus 15 to inject additional conditioning materials onto surface 12A of polishing pad 12. As shown, the input to second hose 23 may be controlled through a multi-position valve 24, which is coupled to a plurality of different polishing and conditioning sources 25-1 through 25-I within dispensing arrangement 14. Various ones of sources 25-1 through 25-I may contain a variety of different polishing slurries, where the application of a specific polishing slurry is controlled through multi-position valve 24 so as to be directed into a supply hose 27. Various other sources within dispensing arrangement 14 may contain conditioning agents that are coupled, as shown, through multi-position valve 24 into second hose 23 and then into conditioning apparatus 15. By controlling the position of multi-position valve 24, therefore, the polishing source (and possibly any conditioning fluid agent) can be changed without incurring any down time (such as, for example, transferring the wafer to a different polishing station, as required by the prior art). Further, dispensing arrangement 14 may be metered so as to adjust the flow rate of the polishing slurry as the planarization of a wafer surface progresses.

The step of removing the effluent from polishing pad surface 12A during conditioning as soon as it is created in accordance with the present invention allows for various alterations in the planarization process to be employed at a single polishing station. For example, the chemistry of the polishing slurry may be altered by switching sources (particularly useful for metal CMP systems where different materials need to be removed from the wafer surface), the temperature of the polishing slurry (or conditioning agent) may be altered by changing from a "room temperature" source to a heated source—or vice versa—(thus changing the rate of chemical removal), the particle size (or concentration) of the slurry may be altered by switching or metering sources, etc. Referring to the diagram of FIG. 1, therefore, a different slurry appropriate for barrier metal removal may be introduced at phase 4 without having to stop the planarization process and move to another polishing station. Without the removal of the effluent in accordance with the present invention, these alterations would be relatively ineffective as a result of the spent materials remaining on the polishing pad surface.

In comparison to prior art conditioning processes and systems, the arrangement of the present invention provides for the conditioning and associated planarization processes to be considerably more efficient. In particular, the inventive arrangement requires the use of significantly less materials (e.g., polishing slurry, cleaning/abrading/flushing conditioning materials) to perform the planarization, conditioning and cleaning operations. Typical wafer planarization processes of the prior art require the dispensing of anywhere from about 140 to 250 ml/minute of polishing slurry to provide stable planarization, since a portion of the reacted slurry will remain in the sponge-like pores of the polishing pad. Using the multi-source arrangement of the present invention with in-situ, evacuated conditioning, the pores of the polishing pad are continuously being cleaned of reacted slurry, presenting the just-conditioned portion of the pad as a fresh, more absorptive "sponge" for the introduction of a different polishing slurry. Therefore, a smaller amount of polishing slurry is able to provide the same stability in the planarization process. Studies have been conducted and have found that the polishing rate for an oxide polish remained stable at various slurry feed rates from 75 ml/minute up to 250 ml/minute. Indeed, the immediate removal of the effluent limits the amount of polishing slurry dilution that would inevitably occur in the prior art, since one by-product of a standard CMP process is water. Moreover, the relatively constant debris removal associated with the present invention results in a CMP system that is less sensitive to fluctuations in polishing slurry flow rate, since there are little, if any, process materials remaining on the pad surface.

In one exemplary process, the positioning of multi-position valve 24 can be used to apply a first, "rough" polishing slurry of a particular chemistry to polishing pad 12 (such as phase 1 of FIG. 1), where polishing source 25-1 is coupled through valve 24 and supply hose 27 to polishing pad surface 12A, thus removing large particulates from surface 11A of wafer 11. As the portion of polishing pad 12 that performed this polishing step moves underneath conditioning apparatus 15, a flushing agent/vacuum is applied (the flushing agent being dispensed, for example, from source 25-2 through multi-position valve 24 to conditioning apparatus 15) to remove the spent slurry and polished-off particulate and present a clean polishing pad surface 12A for the next planarization cycle. A different polishing slurry, perhaps containing a lesser particle concentration and stored within polishing source 25-3, can then be delivered through supply hose 27 of dispensing arrangement 14 to polishing pad 12 and used to perform an even finer polishing process (such as phase 2) on wafer surface 11A without fear of contamination from the prior slurry. The removed wafer material and spent polishing agent are again evacuated from surface 12A of polishing pad 12 as it moves under conditioning apparatus 15 (where the flushing agent within source 25-2 may be used to assist in the debris removal process). Another planarization may then be performed, perhaps using a polishing slurry of a different chemistry (such as for phase 4), stored in polishing source 25-4. Inasmuch as the previously-used polishing slurry and other debris have been completely removed from surface 12A of polishing pad 12 during the conditioning operation, cross-contamination between polishing slurries is avoided.

The arrangement of the present invention has been developed to provide a method of removing debris and spent slurry during each conditioning phase, as soon as it has reacted, or been in contact with, the planarization process. In addition to providing the ability to change from one slurry source to another, as discussed above, the system of the present invention allows for a "neutralization" material to be dispensed as a conditioning agent to further reduce the possibility of cross-contamination of the chemistries from different polishing slurry sources, where the neutralizing agent may be stored in yet another source 25-H and controlled through valve 24 to enter conditioning apparatus 15. In another variation, one or more surfactants (from another source 25-I) can be introduced onto the polishing pad surface during the inventive in-situ conditioning process. The introduction of certain surfactant(s) functions to alter the net surface charge ("zeta potential") of surface 12A as related to the current pH level. The charge alteration may lead to a reversal of attraction between the polished surface and the particles, which in turn may lead to a simplified post-CMP cleaning process. That is, since the surfactant(s) enables polishing pad 12 (and/or wafer surface I 1A) to repel the charged debris particles remaining on its surface, virtually all particle debris will be eliminated. This effluent elimination also allows for typical multi-step wafer cleaning chemistries to be applied to the pad surface and used for in-situ wafer scrubbing.

An advantage of the arrangement of the present invention is to allow for multi-step polishing on each platen, virtually eliminating intermediate product handling between polishing steps. This allows for increased through-put by allowing a more aggressive first polishing step, with subsequent "soft landing" or finer abrasive/chemically-selective slurry sources used near endpoint. Moreover, the same CMP system may be used for copper CMP and barrier metal CMP, since multiple slurry sources can be connected through the same inlet system without cross-contamination, since the pad is being cleaned of upstream chemistries.

The ability to manage the temperature of the conditioning process is considered to be another significant aspect of the present invention. There are various aspects of the CMP process that result in generating heat at the polishing pad surface. For example, certain chemical reactions between the polishing slurry and wafer surface material will generate heat as a by-product. The abrasive action/frictional force between the polishing slurry, polishing pad and wafer results in the mechanical generation of heat. Thus, the ability to dispense materials (such as UPW) of a specified temperature during the conditioning process allows for the polishing pad surface temperature to be stabilized.

Figure 4:
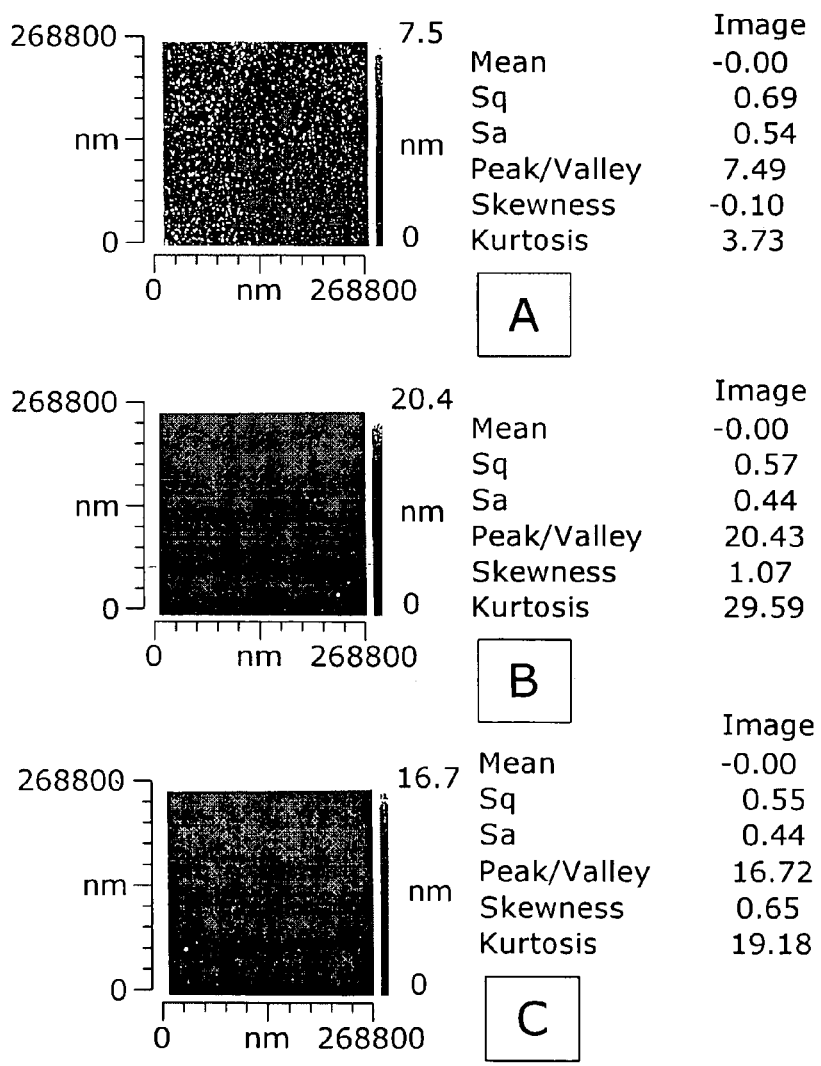
FIG. 4 contains surface quality images for various wafers subjected to the multi-step polishing/conditioning process of the present invention.

To demonstrate the feasibility of integrating a copper-removing slurry and barrier-removing slurry into one process, a set of three in-situ conditioning experiments were performed. The first conditioning experiment, using "prior art" parameters was conducted with "no vacuum" and "no flush" applied during conditioning. The copper removal rate was set at 3000 A/min. The next two conditioning experiments were performed with "vacuum/no flush" and "vacuum/flush", respectively. The material removal rate was found, in these two instances, to be 3000 A/min and 2100 A/min, respectively. This indicates that the introduction of vacuum with no flush has little, if any, effect on the material removal rate. The surface quality results for these experiments are shown in FIG. 4, where FIG. 4A illustrates in-situ conditioning with no vacuum and no de-ionized water (DI) flush, FIG. 4B illustrates in-situ conditioning with vacuum and no DI flush, and FIG. 4C illustrates in-situ conditioning with both vacuum and DI flush. The optical profilmeter images show that performing a multi-step polishing process at a single station by altering the slurry chemistry during the polishing process does not create any corrosion spots or obvious defects. Indeed, a slight improvement in surface quality is observed when the polish is conducted with a condition process including both vacuum and flush. The images in FIG. 4 show no significant changes in the surface quality for the three different conditions.

Based on the study described above, a polishing sequence can be established according to the phases illustrated in FIG. 1. In this feasibility study, phase 1 was ignored and two tests were established to evaluate removal rates vs. target during the transition phases between copper and the barrier material. The main focus of the first test was on phases 2–4, with two different conditions used in phase 4. The polishing for phase 2 was conducted at a slurry strength less than that for the slurry which was used for phase 1, with conventional in-situ conditioning (vacuum off, flush off). The copper slurry was switched off at the end of phase 3, and the barrier slurry was introduced to start phase 4. During phase 4, both vacuum and flush were "on". As shown below in Table I, the integration scheme of the present invention is useful in improving the polishing results. More specifically, the total amount of copper removal (from phases 2 through 4) is almost the same as for all four of the phases combined. This is a clear indication that the integration of both copper and barrier removal into one process is possible as a further optimization of the overall polishing rate.

TABLE 1

Copper material removal for experiments demonstrating integration scheme

| Experiment | Vacuum | Flush | Target Removal Rate (A/min) | Actual Removal Rate (A/min) | Polishing time (min) |
|---|---|---|---|---|---|
| Phase 2 alone | Off | off | 3000 | 2920 | 1 |
| Phase 3 alone | On | on | 2000 | 2414 | 1 |
| Phase 4 alone | On | on | 50 | 323 | 1 |
| Total material removal (4 steps) | Vary | vary | 6000 | 6098 | 4 |
| Total material removal (1 step) | Vary | vary | 6000 | 6055 | 4 |

While the present invention has been described with reference to several particular exemplary embodiments, those skilled in the art will recognize that many changes may be made thereto. Indeed, the subject matter of the present invention is considered only as being limited by the scope of the claims appended hereto.

What is claimed is:

1. A method of providing an in-situ process for conditioning the surface of a polishing pad used in a chemical mechanical planarization (CMP) process, the in-situ conditioning process comprising the steps of:
   a) processing the surface of a polishing pad to dislodge contaminants associated with the CMP process;
   b) evacuating the dislodged contaminants away from the polishing pad to prepare a cleaned polishing pad surface; and
   c) presenting the cleaned polishing pad surface for use in a subsequent planarization operation.

2. The method as defined in claim 1 wherein steps a) and b) are performed subsequent to each planarization operation so as to remove contaminants and prevent cross-contamination between planarization operations.

3. The method as defined in claim 1 wherein in performing step a), the surface of the polishing pad is abraded to dislodge the contaminants.

4. The method as defined in claim 1 wherein step b) further includes introducing a conditioning agent onto the polishing pad surface to assist the conditioning process.

5. The method as defined in claim 4 wherein ultra-pure water (UPW) is applied as the conditioning agent.

6. The method as defined in claim 4 wherein the temperature of the introduced conditioning agent is controlled to affect the temperature of the polishing pad surface.

7. The method as defined in claim 4 wherein the chemistry of the introduced conditioning agent is selected to neutralize the reaction of any previously-applied CMP process materials with the wafer surface.

8. The method as defined in claim 7 wherein the previously-applied CMP process materials include a polishing slurry.

9. The method as defined in claim 1 wherein in performing step b), a vacuum force is applied to evacuate the dislodged contaminants.

10. The method as defined in claim 1 wherein subsequent to presenting the cleaned polishing pad, a polishing slurry is introduced onto the cleaned polishing pad without resulting in cross-contamination effects with the chemistry of prior-applied CMP materials.

11. The method as defined in claim 10 wherein the prior-applied CMP materials include a prior-applied polishing slurry.

12. The method as defined in claim 11 wherein the subsequent polishing slurry exhibits different chemical characteristics than the prior-applied polishing slurry.

13. The method as defined in claim 11 wherein the subsequent polishing slurry exhibits a different abrasive particulate concentration than the prior-applied slurry.

14. The method as defined in claim 11 wherein the subsequent polishing slurry exhibits a different abrasive particulate size than the prior-applied polishing slurry.

15. The method as defined in claim 10 wherein the prior-applied CMP materials include a prior-applied conditioning agent.

16. The method as defined in claim 1 wherein in performing step a), a diamond-surfaced conditioning disk is rotated on the polishing pad surface to dislodge the contaminants from the polishing pad surface.

17. A chemical mechanical planarization (CMP) system for performing multi-step polishing at a single polishing station, the system comprising
   a polishing pad for interacting with a semiconductor wafer surface to remove unwanted material from the surface thereof;
   a conditioning apparatus disposed over at least a portion of the polishing pad, the conditioning apparatus including an abrasive, apertured conditioning disk for abrading the polishing pad to dislodge debris, and a vacuum-assisted component to remove the dislodged debris as it is created; and
   a dispenser for introducing a plurality of polishing slurries onto the cleaned polishing pad in a controlled manner, wherein the conditioning performed by the conditioning apparatus functions to remove contaminants from the polishing pad between each polishing operation, thus presenting a clean polishing pad surface for each planarization operation and preventing cross-contamination between polishing slurries.

18. The CMP system of claim 17 wherein the dispenser is further capable of introducing various conditioning agents to the conditioning apparatus so as to assist in the cleaning operation at the polishing pad surface.

19. The CMP system of claim 17 wherein the dispenser includes at least a neutralizing conditioning agent to prevent cross-contamination between polishing slurries of different chemistries.

20. The CMP system of claim 17 wherein the dispenser includes a conditioning agent exhibiting a predetermined temperature associated with maintaining a desired operating temperature at the polishing pad surface.

21. The CMP system of claim 17 wherein the dispenser includes a conditioning agent including a surfactant element to reduce the electrical attraction between debris particles and the polishing pad surface.

22. The CMP system of claim 17 wherein the dispenser introduces polishing slurries from multiple sources.

23. A chemical mechanical planarization (CMP) system for performing multi-step polishing at a single polishing station, the system comprising a polishing pad for interacting with a semiconductor wafer surface to remove unwanted material from the surface thereof; and a conditioning apparatus disposed over at least a portion of the polishing pad, the conditioning apparatus including a dispenser for introducing polishing or conditioning materials onto the polishing pad surface in a controlled manner;

an abrasive, apertured conditioning disk for abrading the polishing pad to dislodge debris and clean the polishing pad surface; and a vacuum-assisted component to remove the dislodged debris through the apertured conditioning disk as debris is created, wherein the conditioning apparatus removes contaminants between each polishing operation.

24. A chemical mechanical planarization (CMP) system as defined in claim 23 wherein the conditioning apparatus functions to present a clean polishing pad surface for each sequential step in the multi-step polishing process, thereby preventing cross-contamination between the polishing or conditioning materials dispensed onto the polishing pad surface.

* * * * *